United States Patent
Cobb et al.

(10) Patent No.: US 8,115,904 B2
(45) Date of Patent: Feb. 14, 2012

(54) ILLUMINATION SYSTEM FOR SIZING FOCUSED SPOTS OF A PATTERNING SYSTEM FOR MASKLESS LITHOGRAPHY

(75) Inventors: Joshua Monroe Cobb, Victor, NY (US); Paul Francis Michaloski, Rochester, NY (US)

(73) Assignee: Corning Incorporated, Corning, NY (US)

( * ) Notice: Subject to any disclaimer, the term of this patent is extended or adjusted under 35 U.S.C. 154(b) by 521 days.

(21) Appl. No.: 12/471,642

(22) Filed: May 26, 2009

(65) Prior Publication Data
US 2009/0296064 A1 Dec. 3, 2009

Related U.S. Application Data

(60) Provisional application No. 61/130,363, filed on May 30, 2008.

(51) Int. Cl.
  G03B 27/72 (2006.01)
  G03B 27/54 (2006.01)
(52) U.S. Cl. .......................................... 355/71; 355/67
(58) Field of Classification Search .................... 355/71, 355/67
See application file for complete search history.

(56) References Cited

U.S. PATENT DOCUMENTS

| | | | |
|---|---|---|---|
| 6,473,237 B2 | 10/2002 | Mei | |
| 6,876,494 B2 | 4/2005 | Ishikawa et al. | |
| 6,930,761 B2 | 8/2005 | Ishikawa et al. | |
| 7,123,417 B2 | 10/2006 | Ishikawa et al. | |
| 7,145,639 B2 | 12/2006 | Ishikawa et al. | |
| 7,164,523 B2 | 1/2007 | Ishii et al. | |

FOREIGN PATENT DOCUMENTS

| | | |
|---|---|---|
| EP | 1816520 A2 | 8/2007 |
| WO | 97/34171 A2 | 9/1997 |

OTHER PUBLICATIONS

M. Born, E. Wolf: "Principles of Optics"; 1980; Cambridge University Press, Oxford, p. 58, XP002543577.

*Primary Examiner* — Hung Henry Nguyen
*Assistant Examiner* — Michelle Iacoletti
(74) *Attorney, Agent, or Firm* — Timothy M. Schaeberle (57) ABSTRACT

An optical system for producing a pattern of focused spots, such as a maskless lithographic projection system, includes an illuminator, a pattern generator, and an imager. The illuminator includes a light source for generating a light beam, a homogenizer for evenly dispersing light within the light beam, and a condenser for coupling the light source to the homogenizer. The pattern generator has individually addressable elements illuminated by the light beam from the illuminator. The imager images the addressable elements of the pattern generator onto corresponding focusing elements for forming focused spots that are conjugate to aperture stops in both the imager and the illuminator. The illuminator underfills the imager aperture stop for reducing the size of the focused spots. The condenser underfills the illuminator aperture stop for further controlling the size and shape of the focused spots.

32 Claims, 4 Drawing Sheets

FIG. 8A

ILLUMINATION SYSTEM FOR SIZING FOCUSED SPOTS OF A PATTERNING SYSTEM FOR MASKLESS LITHOGRAPHY

CROSS-REFERENCE TO RELATED APPLICATIONS

This application claims the benefit of priority under 35 U.S.C. §119(e) of U.S. Provisional Application Ser. No. 61/130,363 filed on May 30, 2008.

TECHNICAL FIELD

Within systems for producing controllable patterns of focused spots, such as projection systems for maskless lithography, the invention relates to illuminators of such systems, especially such illuminators that affect the size or shape of the focused spots.

BACKGROUND

Spatial light modulators together with adapted projection systems of so-called "maskless" lithographic systems replace reticles of conventional lithographic systems to provide for imaging onto light-sensitive substrates patterns that are not limited by the physical boundaries or particular patterns of the reticles. Instead of imaging static patterns within the reticles, the maskless lithographic systems image dynamic patterns of focused spots that are individually switched between on and off states while being translated across the substrates.

The spatial light modulators include an array of elements that are individually addressable for functioning as light switches that control a spatial distribution of light. The associated projection system focuses light regulated by each of the elements into a pattern of focused spots, which is relayed (or imaged directly) onto the light-sensitive substrates. Typically, the projection system forms a magnified image of each of the individually addressable elements on corresponding microlenses of a microlens array, and the individual microlenses of the microlens array concentrate the light from the individual addressable elements through the focused spots.

Although both the focusing of the microlenses of the microlens array and the magnification of the projection system result in the focused spots being spaced apart, the pattern of focused spots can be relatively oriented and translated for selectively illuminating every point on the substrate. Typically, the pattern of focused includes multiple rows of focused spots and the rows are oriented at a slight angle to a direction of translation with respect to the substrate so that successive rows of the focused spots collectively sweep whole areas of the substrate. The resolution at which a pattern can be traced onto the substrate relates to the size of the focused spots.

The size of the focused spots can be reduced by increasing the numerical apertures of the microlenses of the microlens array. Increasing the numerical apertures of the lenses correspondingly reduces depth of focus. In addition, changing the numerical apertures of the lenses involves major changes and subsequent realignment of the components of the projection system.

SUMMARY

The invention, among its preferred embodiments of focal spot patterning systems, provides two-stage control over focused spot sizes, shapes, and intensity distributions within the spots. Both stages are preferably carried out within an illuminator for controlling the focused spots without altering a projection system that is otherwise optimized for imaging patterns of the focused spots onto substrates. The illuminator evenly illuminates addressable elements of the spatial light modulator, and an imager of the projection system images the addressable elements of the spatial light modulator onto corresponding microlenses of a microlens array that converts the images into the focused spots. Aperture stops in both the illuminator and the imager are conjugate (i.e., effectively conjugate for relaying an image of the light pattern within the illuminator aperture stop) to the focused spots. At a first stage, the numerical aperture of the illuminator is reduced with respect to the numerical aperture of the imager so that an image of the illuminator aperture stop underfills the imager aperture stop. At a second stage, the illuminator aperture itself is effectively underfilled. Thus, the overall size of the focused spots is reduced by factors relating to both the amount the illuminator aperture stop underfills the imager aperture stop and by the amount the illuminator aperture stop itself is underfilled.

The underfilling of the illuminator aperture stop can be regulated to control not only the size of the focused spots but also the shape of the focused spots as well as the distribution of light within the focused spots. The boundaries of the focused spots are understood in a conventional sense as encompassing the full width half maximum (FWHM) of their intensity distributions, since the diffractive nature of light precludes true edges at such small sizes. The underfilling of the illuminator aperture stop can be defined by locating at least part of the FWHM (full width half maximum) of the irradiance distributions inside the illuminator aperture stop. Although convoluted with the diffraction effects of the microlenses in the microlens array, the FWHM boundaries of the focused spots derive from the image of the illuminator aperture stop as reduced by the FWHM boundaries of the fill pattern inside the illuminator aperture stop. Conversely, the full filling of the illuminator aperture stop can be defined by locating the FWHM (full width half maximum) of the irradiance distributions outside the illuminator aperture stop. In a practical sense, the underfilling of the illuminator aperture stop can include any departure from a full filling of the illuminator aperture stop that reduces at least one dimension of the focused spots.

A condenser that directs light from a light source into the illuminator aperture stop can be arranged or subsequently adjusted to affect angular or spatial light distributions including different distributions in orthogonal directions to set the focused spot size, shape, and intensity distributions. The changes in shape and intensity distributions can be controlled to compensate for aberrations or other unintended effects of the illuminator or projection system on the focused spots or to optimize the focused spots for particular purposes. For example, flatness distortions in the spatial light modulator pixels can undesirably affect the shape and intensity distribution of light within the focused spots and the prescribed changes in the illuminator can be used to restore a desired spot shape and intensity distribution. Alternatively, the focused spots can be narrowed perpendicular to the scan direction to enhance resolution in one direction.

One version of the invention as a focal spot patterning system includes an illuminator that collects light from a light source and illuminates addressable elements of a pattern generator. An imager images the addressable elements of the pattern generator onto corresponding focusing elements that form focused spots in a pattern controlled by the pattern generator. The illuminator has an aperture stop conjugate to both an aperture stop of the imager and the focused spots. The imager has a numerical aperture exceeding a numerical aperture of the illuminator. As such, a pattern of light within the aperture stop of the illuminator is imaged within the aperture stop of the imager at a size less than the aperture stop of the imager for underfilling the imager aperture stop. In addition, optics within the illuminator direct light from the light source through the illuminator aperture stop in a form that effectively underfills the illuminator aperture stop.

Preferably, optics within the illuminator distribute light within the imager aperture stop in a form that reduces a dimension of the focused spots. For example, the condenser can include a collecting optic that gathers light from a light source and partially fills the illuminator aperture stop and a diffuser that expands the angular distribution of light from the light source. Either the collecting optic or the diffuser can be arranged to produce different distributions of light in two orthogonal directions (i.e., non-rotationally symmetric distributions) for altering the shape of the focused spots. The optics within the illuminator can also include an apodizer that alters the effective distribution of light within the illuminator aperture stop. For purposes of effectively underfilling the illuminator aperture stop, the apodizer can be located either before or after the illuminator aperture stop, since it is the image of the illuminator aperture stop appearing within the imager aperture stop that must be underfilled by the illuminator. The optics within the illuminator can include an adjustable optical device for adjusting the amount by which the illuminator aperture is effectively underfilled. For example, the adjustable optical device can include a zoom lens.

Another version of the invention as an optical system for producing a pattern of focused spots includes an illuminator having a light source for generating a light beam, a homogenizer for more evenly dispersing light within the light beam, and a condenser for coupling the light source to the homogenizer. The light beam illuminates individually addressable elements of a pattern generator for patterning the light beam. An imager images the addressable elements of the pattern generator onto corresponding focusing elements for forming focused spots that are conjugate to aperture stops in both the imager and the illuminator. The illuminator is geometrically related to the imager so that the aperture stop of the illuminator images within the aperture stop of the imager at a size less than a size of the imager aperture stop for reducing a size of the focused spots. The condenser cooperates with the homogenizer for effectively underfilling the illuminator aperture stop for further reducing a dimension of the focused spots.

The homogenizer preferably includes first and second fly's eye lens arrays and a combiner optic. The first fly's eye lens array divides the light beam into a plurality of beamlets through respective apertures of the first fly's eye lenses, and the second fly's eye lens array together with the combiner superimposes images of the first fly's eye lens apertures onto the addressable elements of the pattern generator. The condenser can include a collecting optic having a focal length that is related to a focal length of the first fly's eye lenses so that the beamlets underfill apertures of the second fly's eye lenses for distributing light from the light beam among additional lenses of the second fly's eye lens array. The collecting optic can be arranged with different focal lengths in two orthogonal directions for altering a shape of the focused spots. The condenser can also include a diffuser for altering an angular distribution of light incident upon the first fly's eye lens array to distribute light from the light beam among more lenses of the second fly's eye lens array. The diffuser can be arranged to have different angular dispersing characteristics in two orthogonal directions for altering a shape of the focused spots. An apodizer can be associated with the illuminator aperture stop for adjusting the distribution of light within the focused spots in either a radially symmetric or asymmetric form.

Another version of the invention as a focal spot patterning system includes an illuminator that receives light from an extended light source for illuminating addressable elements of a pattern generator. Focusing elements associated with the addressable elements of the pattern generator form focused spots in a pattern controlled by the pattern generator. An imager includes optics for imaging the addressable elements of the pattern generator onto the associated focusing elements. The imager has an aperture conjugate to both an aperture of the illuminator and the focused spots. The apertures of the focusing elements are conjugate to the addressable elements of the pattern generator. Optics within the illuminator direct light from the light source through the illuminator aperture stop in a non-rotationally symmetric form for altering a shape of the focused spots.

Another version of the invention as a method of forming a pattern of focused spots having a limited size includes generating a light beam within an illuminator and illuminating individually addressable elements of a pattern generator with the illuminator. The addressable elements of the pattern generator are imaged onto corresponding focusing elements with an imager for forming focused spots in a pattern controlled by the pattern generator. The focusing elements form the focused spots conjugate to aperture stops in both the imager and the illuminator. The aperture stop of the illuminator is imaged within the aperture stop of the imager at a size less than a size of the imager aperture stop for reducing a dimension of the focused spots. The illuminator aperture stop is also effectively underfilled with light from the light source for further reducing the same or reducing a different dimension of the focused spots.

Preferably, the focusing elements are angularly aligned to a common optical axis and the step of forming focused spots includes producing radiance distributions having centroids of energy parallel to the optical axis. The centroids of energy can be so aligned by controlling distributions of light energy within the illuminator aperture stop.

The distribution of light within the illuminator aperture stop can be differentially controlled in two orthogonal directions producing non-rotationally symmetric distributions for altering a shape of the focused spots. The alterations imposed on the focused spots from the illuminator can be used to compensate for aberrations or other unintended effects of the pattern generator or projection system (including the microlens array) to restore the focused spots to an intended form or to reshape the focused spots for particular purposes. For example, the focused spots can be modified to have an elliptical shape with a major axis aligned in a direction of relative translation between the pattern of focused spots and a substrate.

DETAILED DESCRIPTION

Figure 1:
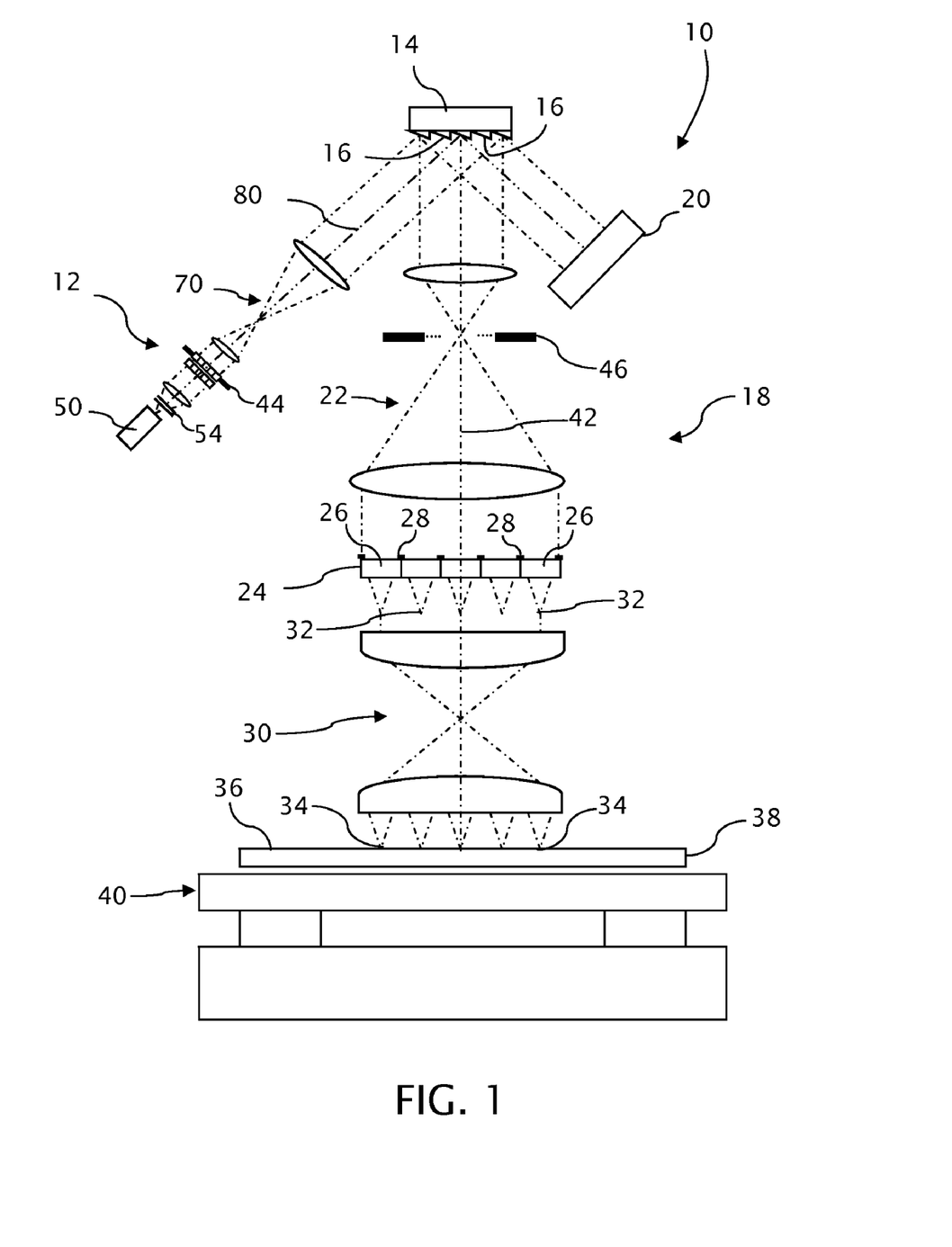
FIG. 1 is a diagram of a maskless lithography system having an illuminator arranged for controlling a focused spot size of a pattern of focused spots on a substrate.

A maskless lithography system 10 as an example of a focal spot patterning system is adapted in accordance with the invention, particularly with respect to the relative configuration of an illuminator 12. A pattern generator 14 including individually addressable elements 16 receives homogenized light from the illuminator 12 for directing discrete portions of the light to either a projection system 18 or to a beam dump 20 depending on the addressable states of the elements 16.

An imager 22 of the projection system 18 images the addressable elements 16 of the pattern generator 14 onto corresponding microlenses 26 of a microlens array 24. A sufficient numerical aperture (e.g., 0.08 or higher) is chosen for the imager 22 to accurately reproduce magnified images of the addressable elements 16 on the microlenses 26 with sufficient resolution to avoid significant crosstalk or overlap onto adjacent microlenses 26. Field stops 28 surround the entrance apertures of the microlenses 26 to block light scattered from edges of the addressable elements 16. A relay lens 30 images focal points 32 of the microlenses 26 as a pattern of focused spots 34 on a surface 36 of light-sensitive substrate 38. A stage 40 relatively translates the light-sensitive substrate 38 along one or more orthogonal axes with respect to the pattern of focused spots 34. The focused spots 34 are preferably translatable with respect to the stage 40 along an optical axis 42 of the projection system 18 for adjusting the focused spots 34 to their intended positions on the substrate surface 36. The focal points 32 are also referred to as focused spots interchangeably with the focused spots 34, and if desired, can be imaged directly onto the substrate 38.

The pattern generator 14, which is preferably a type of spatial light modulator, can take a variety of forms modulating transmission or reflection based on a number of different mechanisms including phase-shifting, diffraction, polarization modulation, shuttering, or directional reflection. Depicted as a programmable mirror array, the pattern generator 14 is preferably a digital micromirror device of a type sold by Texas Instruments Incorporated as DLP® technology.

The illuminator 12 has (a) a numerical aperture at the pattern generator 14 that is less than the numerical aperture of the imager 22 at the pattern generator 14 and (b) an aperture stop 44 that is conjugate to an aperture stop 46 of the imager 22, the focal points 32 of the microlens array 24, and the focused spots 34 on the substrate surface 36. As such, the illuminator aperture stop 44 is imaged within the imager aperture stop 46 at a size less than a size of the imager aperture stop 46. The illuminator 12 underfills the aperture stop 46 of the imager 22 in a ratio of apertures (illumination aperture diameter to imager aperture diameter) referred to as partial coherence parameter $\sigma$, which is inversely related to spatial coherence. Since the focused spots 34 are conjugate to the imager aperture stop 46 and the imager aperture stop 46 is underfilled as a consequence of the partial coherence parameter $\sigma$ being less than unity, the size of the focused spots 34 (e.g., focal diameter at FWHM) is also reduced while the focal depth is increased. As a further consequence of the partial coherence parameter $\sigma$ being less than unity, light distributions within the illuminator aperture stop 44 can directly affect the size, shape, and intensity distributions of the focused spots 34 as well as the placement positions of the focused spots based on the telecentricity of the illuminator at the pattern generator 14.

Conventionally, the partial coherence parameter $\sigma$ is set for optimizing the imaging of high spatial frequency objects such as the reticles of lithographic projection systems. For purposes of the invention, however, the partial coherence factor $\sigma$ relating the illuminator 12 to the imager 22 is not optimized for imaging of the pattern generator 14 onto the microlens array 24. Instead, the partial coherence parameter $\sigma$ is optimized to regulate the range of angles through which the focused spots 34 are formed at an opposite conjugate. Field stops 28 effectively exclude higher spatial frequencies from participating in the formation of the focused spots 34. The higher spatial frequencies arise from diffraction effects at edges of the addressable elements 16 (e.g., micromirrors) and are subject to field filtering at the entrance apertures of the microlenses 26.

Figure 2:
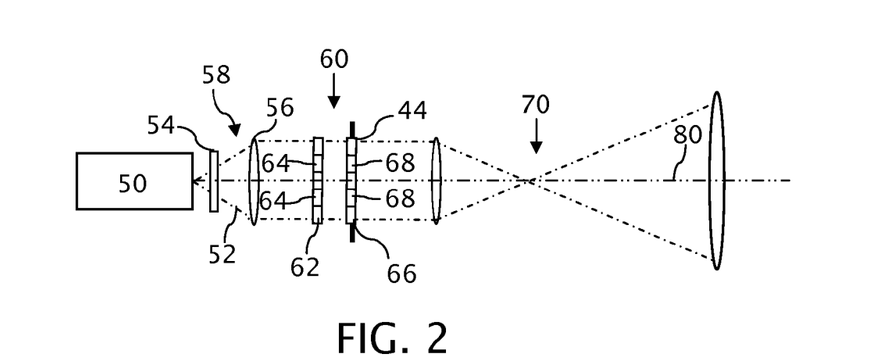
FIG. 2 is a relatively enlarged diagram of the illuminator including a diffuser for controlling light distribution within an aperture stop of the illuminator.

An enlarged view of the illuminator 12 is shown in FIG. 2. An extended light source 50 emits an expanding beam 52, which is further expanded by a diffuser 54 acting in concert with a collecting lens 56 and together functioning as a condenser 58 for coupling light into a homogenizer 60 over an area that at least partially underfills the illuminator aperture stop 44. The diffuser 54 preferably functions to fill more of the illuminator aperture stop 44, which would otherwise be even more underfilled. The collecting lens 56, which is preferably a collimator, is sized to accommodate a further expansion of the beam 52 to control the transverse area of the beam 52 incident upon the homogenizer 60 and associated aperture stop 44.

The extended light source 50 preferably includes a cluster of light emitters arranged in an array having an aspect ratio matching the aspect ratio of the pattern generator 14. For example, a plurality of laser diodes (not shown) can be coupled to a set of multimode optical fibers (not shown) with light emitting ends that are bundled into the desired array. Alternatively, single light sources or other combinations of light sources can be used to inject light into the illuminator 12.

The diffuser 54, which is preferably a holographic diffuser, such as a holographic light shaping diffuser available from Luminit LLC of Torrance, Calif., increases the angular dispersion of light, thereby increasing the effective etendue of the extended light source 50 for spreading the available light over a larger area. For example, light impinging at normal incidence can be spread throughout a Gaussian distribution ranging from 5 degrees to 10 degrees at full width half maximum (FWHM).

The homogenizer 60 is preferably an imaging type homogenizer assembled from two fly's eye arrays 62 and 66. Lenses 64 of the first fly's eye lens array 62 are arranged together with the collecting lens 56 for forming images of the extended light source 50 within apertures of lenses 68 of the second fly's eye lens array 66. A combiner lens 70 together with the lenses 68 of the second fly's eye lens array 66 is arranged for superimposing the images of the apertures of the lenses 64 onto the addressable elements 16 of the pattern generator 14 and for conveying an image of the second fly's eye lens array 66 into the imager aperture stop 46. Preferably, the field apertures of lenses 64 and 68 have an aspect ratio matching the aspect ratio of both the extended light source 50 and the pattern generator 14 to which light from the illuminator 12 is directed and a size approximately equal to the size of the extended light source 50. The homogenizer 60 can take a number of other forms, such as a kaleidoscope, an angular multiplexer, or other types of uniformizers, particularly integrators, such as faceted reflectors or mirrors, for integrating the source 50.

Figure 3:
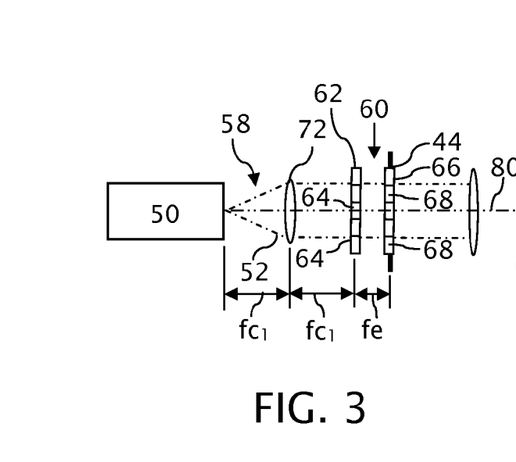
FIG. 3 is a relatively enlarged diagram of an alternative illuminator including a condenser sized for limiting light distribution within an aperture stop of the illuminator.
Figure 3A:
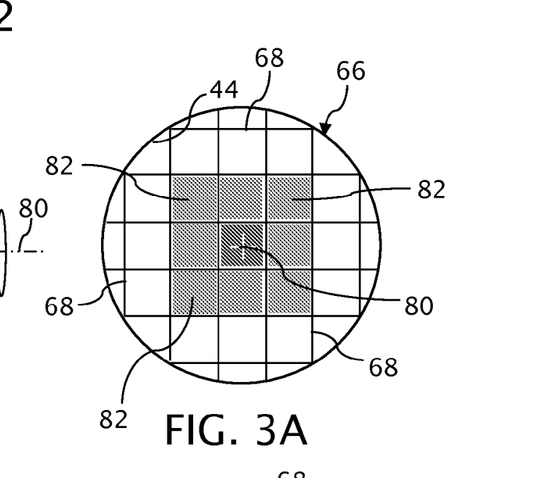
FIG. 3A is an on-axis view of the aperture stop of FIG. 3 showing the limited light distribution.
Figure 4:
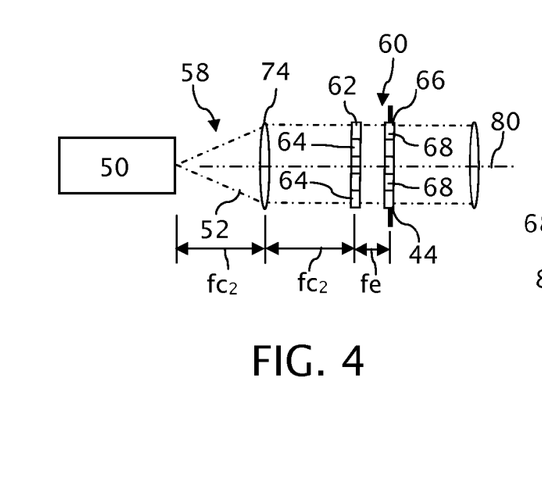
FIG. 4 is a relatively enlarged diagram of an alternative illuminator including a different condenser sized for relatively expanding light distribution within an aperture stop of the illuminator.
Figure 4A:
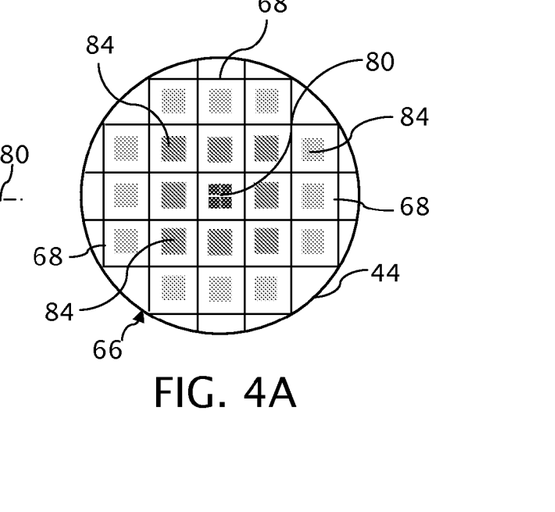
FIG. 4A is an on-axis view of the illuminator aperture stop of FIG. 4 showing the relatively expanded light distribution.

In place of or in addition to the diffuser 54, the illuminator 12 can be modified as shown in FIGS. 3 and 4 by substituting different collecting lenses 72 and 74 having different focal lengths $fc_1$ and $fc_2$ and positions for changing the overall size and distribution of light within the aperture stop 44 as respectively depicted by FIGS. 3A and 4A. A spacing between the fly's eye lens arrays 62 and 66 remains constant at a focal length fe.

The collecting lens 74 is positioned at a larger distance from the extended source 50 for collecting light from the expanding beam 52 throughout a larger pupil than the collecting lens 72. Respective focal lengths of the collecting lenses 72 and 74 are correspondingly adjusted to maintain the image of the extended source 50 at infinity so that, together with the first fly's eye lens array 62, the collecting lenses 72 and 74 produce images 82 or 84 of the extended source 50 within the lens apertures of the second fly's eye lens array 66. Thus, the collecting lens 74 has a longer focal length $fc_2$ than the focal length $fc_1$ of the collecting lens 72, resulting in a corresponding demagnification of the extended source 50 imaged into the apertures of lenses 68 of the second fly's eye lens array 66.

As depicted in FIG. 3A, the smaller pupil collected by the collecting lens 72 only fills lenses 68 near the center of the second fly's eye lens array 66. The images 82 of the extended source 50 appearing within the center lenses 68 substantially correspond in size to the apertures of the lenses 68. Although both the images 82 and the lens 68 appear as squares for ease of illustration, rectangles are more likely in practice to match the aspect ratio of the preferred pattern generator 14 and other shapes can be used for similarly conserving light or for other purposes. An angular distribution of light from the extended source 50, which generally decreases in intensity with increasing angular departure from an optical axis 78 is also apparent (as a change in shade) within the aperture stop 44 of FIG. 3A as a corresponding but incremental decrease in intensity with increasing radial distance of the individual fly's eye lenses 68 from the optical axis 78.

As depicted in FIG. 4A, the larger pupil collected by the collecting lens 74 partially fills more of the lenses 68 extending from the center of the second fly's eye array 66. The images 84 of the extended source 50 appearing within the center lenses 68 are substantially reduced in size with respect to the apertures of the lenses 68. The angular distribution of light from the extended source 50, which generally decreases in intensity with increasing angular departure from an optical axis 78 is apparent within the aperture stop 44 of FIG. 4A as a corresponding but discontinuous and incremental decrease in intensity with increasing radial distance of the individual fly's eye lenses 68 from the optical axis 78. Although the overall size of the focal points 32 (focused spots) produced by the illuminator configuration of FIG. 4 is larger than the size of the focal points 32 (focused spots) produced by the illuminator configuration of FIG. 3, both configurations underfill the aperture stop 44 and produce focused spots that are sized less than the maximum size that could be produced with a fully filled aperture stop 44.

Based on the illuminator arrangements of FIGS. 3 and 4, light within the illuminator aperture stop 44 as shown in FIGS. 3A and 4A is distributed among the lenses 68 of the second fly's eye lens array 66 in a radially symmetric manner. Within an ideal (not aberrated) projection system 18 as configured according to FIG. 1 and ignoring diffraction particularly at the microlens array 24, the radially symmetric distribution of light within the illuminator aperture stop 44 is reproduced (a) in the imager aperture stop 46, (b) in the focal points 32 of the microlens array 24, and (c) in the focused spots 34 on the substrate surface 36 in a circular or disk form. Such reductions in the radial filling (i.e., such radial underfilling) of the illuminator aperture stop 44 contribute further to the underfilling of the imager aperture stop 46 and a further reduction in the size of the focal spots 34.

Figure 5:
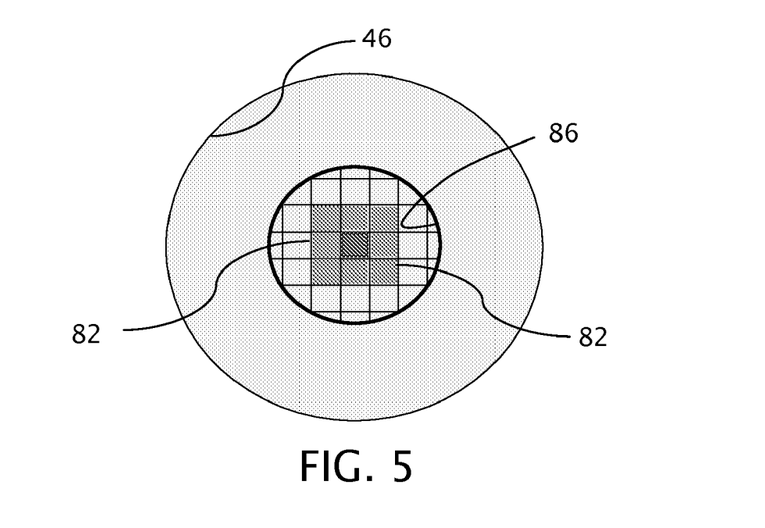
FIG. 5 is an on-axis view of an aperture stop within an imager of a projection system showing both an underfilling of the imager aperture stop by an image of the illuminator aperture stop and an underfilling of the illuminator aperture stop.

An axial view of the imager aperture stop 46 is shown in FIG. 5 depicting the combined effect of (a) underfilling the imager aperture stop 46 by the reduced size of an image 86 of the illuminator aperture stop 44 and (b) underfilling of the illuminator aperture stop 44 by the condenser 58 within the illuminator 12. The condenser 58 limits the radial extent of the fly's eye lenses 68 that are at least partially filled for relaying images 82 the extended light source 50. Most other light within the imager aperture stop 46 arises as a result of diffraction of light from the addressable elements 14 of the pattern generator 14, such as edges of movable mirrors. The diffracted light, which is captured within the aperture stop 46, ensures a sufficient resolution by the imager lens 22 so that edges (i.e., boundaries) of the addressable elements 16 are not imaged beyond the field stops 28 at the microlens array 24. The field stops 28, which function as the respective aperture stops of the microlenses 26 of the microlens array 24, block most of this scattered light from contributing to the formation of the focused spots 34.

Figure 6:
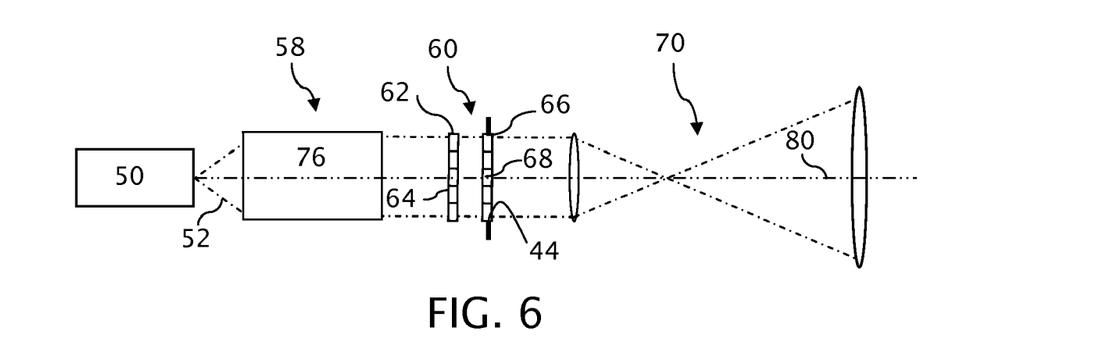
FIG. 6 is a relatively enlarged diagram of an alternative illuminator in which the condenser includes a zoom lens for adjusting light distributions within an aperture stop of the illuminator.

With reference to FIG. 6, a zoom lens 76 can be used in place of the two collecting lenses 72 and 74 to control the amount the illuminating aperture stop 44 is underfilled. The zoom lens 76 adjusts the size of the expanding beam 52 within the illuminator aperture stop 44 while cooperating with the fly's eye lens arrays 62 and 66 to superimpose images of the apertures of the fly's eye lenses 64 from different angular perspectives in the image plane of the illuminator 12, which coincides with the location of the addressable elements 16 of the pattern generator 14.

Figure 7:
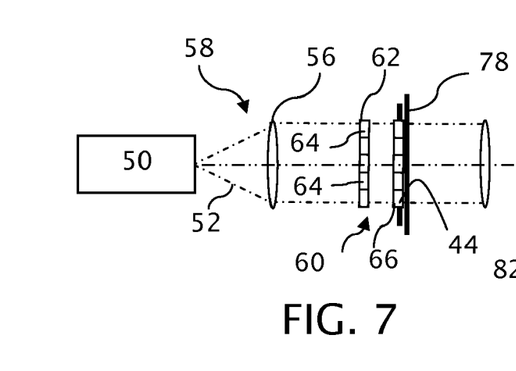
FIG. 7 is a relatively enlarged diagram of an alternative illuminator including an apodizer for adjusting the light distribution within an aperture stop of the illuminator.
Figure 7A:
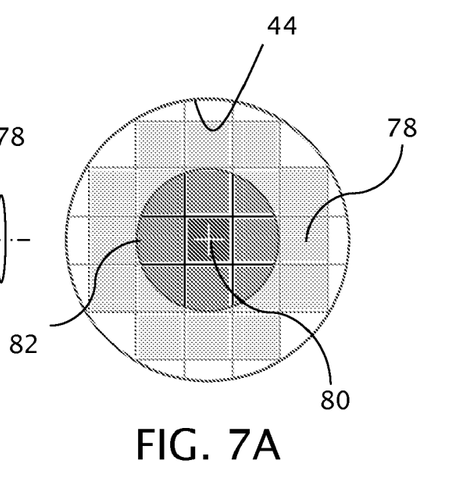
FIG. 7A is an on-axis view of the illuminator aperture stop of FIG. 7 depicting one possible effect of the apodizer for progressively attenuating light approaching the boundary of the aperture stop.

Alternatively, or in addition to the zoom lens 76, either collecting lens 72 or 74, or the diffuser 54, an apodizer 78, as shown in FIG. 7 can be used to regulate the distribution of light passing through the illuminator aperture stop 44. The apodizer 78 can be used to block measured portions of the light to optimize the distribution in light within the illuminator aperture stop 44 for forming the desired focused spots 34 or to compensate for effects elsewhere in the pattern generator 14 or projection system 18 that might otherwise adversely affect the distributions of light from which the focused spots 34 are formed. An annular filtering effect within the illuminator aperture stop 44 is depicted in FIG. 7A as one example of the effect of the apodizer 78. Light is progressively attenuated approaching the boundary of the illuminator aperture stop 44.

Although the apodizer 78 shown in FIG. 7 is located after the illuminator aperture stop 44, the apodizer 78 still provides for effectively underfilling the illuminator aperture stop 44 because the apodizer 78 attenuates light that would otherwise be seen in the image of the illuminator aperture stop 44 appearing within the imager aperture stop 46.

Asymmetric changes can be made within the condenser 58 to alter or correct the shape or intensity distribution of the focused spots 34. For example, the diffuser 54 can be made with holographic patterns that diffuse light by different amounts in two orthogonal directions producing non-rotationally symmetric light distributions. The directionally sensitive diffuser can be angularly oriented about an optical axis 80 so that the asymmetric distributions of light within the illuminator aperture counteract other asymmetries in the pattern generator 14 or projection system 18 (including the microlens array 24) to produce the desired focused spot shapes or contribute to predetermined non-circular shapes of the focused spots in desired orientations. The diffusion can also be radially sensitive in a symmetric or asymmetric manner to affect the distribution of light energy within the focal points 32 (focused spots). Combinations of radially and angular sensitive diffusion can be used for such purposes as optimizing the focal points 32 (focused spots) with respect to their direction of relative translation across the substrate 38.

Figure 8:
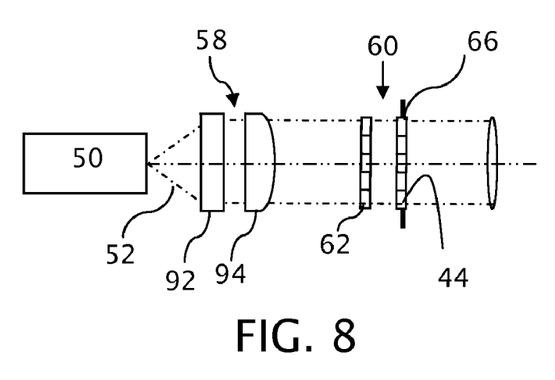
FIG. 8 is a relatively enlarged diagram of an alternative illuminator in which the condenser includes two orthogonally oriented cylindrical lenses for independently controlling light distributions within the illuminator aperture stop in the two orthogonal directions.

The collecting lens of the condenser 58 can also be constructed with different focusing powers in different orthogonal directions as depicted in FIG. 8 to alter or correct the shape of the focused spots 34. For example, the condenser 58 can include two orthogonally oriented cylindrical lenses 92 and 94, each with a focal length related to its distance from the extended source 50 to image the extended source 50 at infinity at two different scales so that a projection of the extended source 50 overlaps different numbers of the lenses 64 of the first fly's eye lens array 62 in the two orthogonal directions.

Figure 8A:
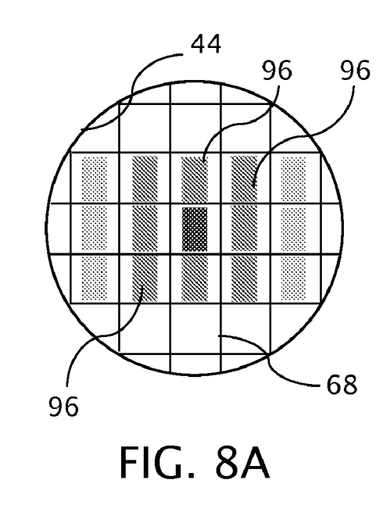
FIG. 8A is an on-axis view of the illuminator aperture stop of FIG. 7 showing different distributions of light in two orthogonal directions.

FIG. 8A depicts an asymmetric distribution of light within the illuminator aperture stop 44 based on the use of a condenser 58 with different focusing powers in two orthogonal directions. For example, along a horizontal axis, images 96 of the extended source 50 are relatively demagnified but spread over more of the lenses 68 of the second fly's eye lens array 66. Along a vertical axis, the images 96 of the extended source 50 remain closer to their true size but are reproduced within fewer lenses 68 of the second fly's eye lens array 66. Preferably, the asymmetric distributions of light include at least a partial boundary within the illuminator aperture stop 44 defined at a threshold intensity corresponding to the full width half maximum (FWHM) of the light distribution. Although trace amounts of light can remain within unfilled portions of the illuminator aperture 44 beyond the FWHM boundary, the trace amounts do not negate the effective reduction in a corresponding dimension of the conjugate focal spots 34, which have corresponding boundaries at FWHM of their light distributions.

Although described with respect to particular embodiments, those of skill in the art will appreciate the various modifications and additions that can be made to the embodiments in accordance with the overall teaching of the invention. For example, although the fly's eye lenses of the homogenizer are described as overlaying images based on the angular distribution of light from the extended source, the fly's eye lenses of the homogenizer could also be arranged for overlaying images based on the spatial distribution of light from the source. Other types of homogenizers or beam integrators could also be used including kaleidoscopes and angular multiplexers. Other devices that affecting angular or spatial distributions of light can be used for controlling the distribution of light within the illuminator aperture, including both active and passive devices.

The invention claimed is:

1. A focal spot patterning system comprising
an illuminator that collects light from a light source and illuminates addressable elements of a pattern generator,
an imager that images the addressable elements of the pattern generator onto corresponding focusing elements that form focused spots in a pattern controlled by the pattern generator,
an aperture stop of the illuminator being conjugate to both an aperture stop of the imager and the focused spots,
the imager having a numerical aperture exceeding a numerical aperture of the illuminator so that a pattern of light within the aperture stop of the illuminator images within the aperture stop of the imager at a size less than the aperture stop of the imager for underfilling the imager aperture stop, and
optics within the illuminator that direct light from the light source through the illuminator aperture stop in a form that effectively underfills the illuminator aperture stop.

2. The patterning system of claim 1 in which the optics within the illuminator distribute light within the imager aperture stop in a form that reduces a dimension of the focused spots.

3. The patterning system of claim 1 in which the optics within the illuminator include a condenser that limits at least one of angular and spatial distributions of light from the light source for influencing distributions of light within the illuminator aperture stop.

4. The patterning system of claim 3 in which the condenser includes a diffuser that expands the angular distribution of light from the light source in at least one direction.

5. The patterning system of claim 3 in which the condenser differentially affects the angular distribution of light in two orthogonal directions for altering a shape of the focused spots.

6. The patterning system of claim 5 in which the condenser includes differential power in two orthogonal directions for altering a shape of the focused spots.

7. The patterning system of claim 1 in which the optics within the illuminator include an apodizer that limits distributions of light within the illuminator aperture stop as imaged within the imager aperture stop.

8. The patterning system of claim 7 in which the apodizer differentially affects transmissions of light through the illuminator aperture stop in two orthogonal directions for altering a shape of the focused spots.

9. The patterning system of claim 1 in which the optics within the illuminator include an adjustable optical device for adjusting the amount by which the illuminator aperture is effectively underfilled.

10. The patterning system of claim 9 in which the adjustable optical device includes a zoom lens.

11. An optical system for producing a pattern of focused spots comprising
an illuminator including a light source for generating a light beam, a homogenizer for more evenly dispersing light within the light beam, and a condenser for coupling the light source to the homogenizer;

a pattern generator having individually addressable elements illuminated by the light beam from the illuminator for patterning the light beam, an imager for imaging the addressable elements of the pattern generator onto corresponding focusing elements for forming focused spots that are conjugate to aperture stops in both the imager and the illuminator, the illuminator being geometrically related to the imager so that the aperture stop of the illuminator images within the aperture stop of the imager at a size less than a size of the imager aperture stop for reducing a size of the focused spots, and the condenser cooperating with the homogenizer for effectively underfilling the illuminator aperture stop for further reducing a size of the focused spots.

12. The optical system of claim 11 in which the homogenizer includes first and second fly's eye lens arrays and a combiner, the first fly's eye lens array dividing the light beam through a plurality of lens apertures into a plurality of beamlets and the second fly's eye lens array together with the combiner superimposing images of the first fly's eye lens apertures onto the addressable elements of the pattern generator.

13. The optical system of claim 12 in which the condenser includes a collecting optic having a focal length that is related to a focal length of the first fly's eye lens so that the beamlets underfill apertures of the second fly's eye lenses for distributing light from the light beam among additional lenses of the second fly's eye lens array.

14. The optical of claim 13 in which the collecting optic includes different focal lengths in two orthogonal directions for altering a shape of the focused spots.

15. The optical system of claim 12 in which the condenser includes a diffuser for altering an angular distribution of light incident upon the first fly's eye lens array to distribute light from the light beam among more lenses of the second fly's eye lens array.

16. The optical system of claim 15 in which the diffuser has different angular dispersing characteristics in two orthogonal directions for altering a shape of the focused spots.

17. The optical system of claim 12 further comprising an apodizer associated with the illuminator aperture stop for reducing the size of the focused spots.

18. The optical system of claim 17 in which the apodizer differentially affects transmissions of light through the illuminator aperture stop in two orthogonal directions for altering a shape of the focused spots.

19. The optical system of claim 12 in which lenses of the first fly's eye lens array are arranged together with the condenser for forming images of the light source within the lens apertures of the second fly's eye lens array.

20. The optical system of claim 19 in which the combiner together with the lenses of the second fly's eye lens array is arranged for superimposing the images of the first fly's eye lens apertures onto the addressable elements of the pattern generator and for conveying an image of the second fly's eye lens array into the imager aperture stop.

21. The optical system of claim 20 in which the condenser includes an adjustable optical device for adjusting the amount by which the illuminator aperture is underfilled.

22. The optical system of claim 20 in which the adjustable optical device is a zoom lens.

23. A method of forming a pattern of focused spots having a limited dimension comprising steps of generating a light beam within an illuminator, illuminating individually addressable elements of a pattern generator with the illuminator, imaging the addressable elements of the pattern generator onto corresponding focusing elements with an imager for forming focused spots in a pattern controlled by the pattern generator, forming the focused spots with the focusing elements conjugate to aperture stops in both the imager and the illuminator, imaging the aperture stop of the illuminator within the aperture stop of the imager at a size less than a size of the imager aperture stop for reducing a dimension of the focused spots, and underfilling the illuminator aperture stop as appearing within the imager aperture stop with light from the light source for further reducing the same dimension or reducing a different dimension of the focused spots.

24. The method of claim 23 in which the focusing elements are angularly aligned to a common optical axis and the step of forming focused spots includes producing radiance distributions having centroids of energy parallel to the optical axis.

25. The method of claim 23 including a step of altering a distribution of light within the illuminator aperture stop.

26. The method of claim 25 in which the step of altering includes differentially altering the distribution of light within the illuminator aperture stop in two orthogonal directions for altering a shape of the focused spots.

27. The method of claim 25 in which said step of altering includes altering at least one of an angular distribution of light and a spatial distribution of light in advance of a homogenizer within the illuminator.

28. The method of claim 26 including the further step of relatively translating the pattern of focused spots across a light-sensitive substrate in a scan direction, and the step of differentially altering includes relatively narrowing the focused spots perpendicular to the scan direction.

29. A focal spot patterning system comprising an illuminator that receives light from an extended light source for illuminating addressable elements of a pattern generator, focusing elements associated with the addressable elements of the pattern generator for forming focused spots in a pattern controlled by the pattern generator, an imager including optics for imaging the addressable elements of the pattern generator onto the associated focusing elements, the imager having an aperture conjugate to both an aperture of the illuminator and the focused spots, apertures of the focusing elements being conjugate to the addressable elements of the pattern generator, and optics within the illuminator that direct light from the light source through the illuminator aperture stop in a non-rotationally symmetric form for altering a shape of the focused spots with respect to a shape of the focused spots associated with light directed through the illuminator aperture stop in a rotationally symmetric form.

30. The patterning system of claim 29 in which the optics within the illuminator include a diffuser that differentially affects the angular distribution of light in two orthogonal directions for altering a shape of the focused spots.

31. The patterning system of claim 29 in which the optics within the illuminator include differential power in two orthogonal directions for altering a shape of the focused spots.

32. The patterning system of claim 29 in which the optics within the illuminator include an apodizer that differentially limits transmissions of light through the illuminator aperture stop in two orthogonal directions for altering a shape of the focused spots.

* * * * *